United States Patent
Chatterjee et al.

(10) Patent No.: US 6,413,824 B1
(45) Date of Patent: Jul. 2, 2002

(54) METHOD TO PARTIALLY OR COMPLETELY SUPPRESS POCKET IMPLANT IN SELECTIVE CIRCUIT ELEMENTS WITH NO ADDITIONAL MASK IN A CMOS FLOW WHERE SEPARATE MASKING STEPS ARE USED FOR THE DRAIN EXTENSION IMPLANTS FOR THE LOW VOLTAGE AND HIGH VOLTAGE TRANSISTORS

(75) Inventors: Amitava Chatterjee; Alec J. Morton, both of Plano; Mark S. Rodder, University Park; Taylor R. Efland, Richardson; Chin-Yu Tsai; James R. Hellums, both of Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/589,953

(22) Filed: Jun. 8, 2000

Related U.S. Application Data

(60) Provisional application No. 60/138,728, filed on Jun. 11, 1999.

(51) Int. Cl.[7] .......................................... H01L 21/8234
(52) U.S. Cl. .................. 438/275; 438/232; 438/279; 438/286
(58) Field of Search ................................ 438/199, 200, 438/232, 286, 279, 275

(56) References Cited

U.S. PATENT DOCUMENTS

| | | | | |
|---|---|---|---|---|
| 4,651,406 A | * | 3/1987 | Shimizu et al. | |
| 5,534,449 A | * | 7/1996 | Dennison et al. | |
| 6,004,854 A | * | 12/1999 | Dennison et al. | ............ 438/306 |
| 6,165,825 A | * | 12/2000 | Odake | .......................... 438/217 |

OTHER PUBLICATIONS

Taur et al., "CMOS Devices below 0.1μm: How High Will Performance Go?" IBM Research, Yorktown Heights, NY and Microelectronics Division, Essex Junction, VT 0–7803–4103–1 (c) 1997 IEEE.

Gwoziecki et al., "Smart pockets—total suppression of roll–off and roll up," France Telecom, CNET Grenoble, BP 98, 38243 Meylan Cedex, France, 4–930813–94–8/99.

Cao et al., "Modeling of Pocket Implanted MOSFETs for Anomalous Analog Behavior," Department of Electrical Engineering and Computer Sciences, University of California, Berkeley, CA 94720, USA, Spice Modeling Lab., Texas Instruments, Dallas, Texas 75266, U.S.A., 0–7803–5413–3/99, 1999 IEEE.

* cited by examiner

*Primary Examiner*—Long Pham
(74) *Attorney, Agent, or Firm*—Jacqueline J. Garner; W. James Brady III; Frederick J. Telecky, Jr.

(57) ABSTRACT

High performance digital transistors (140) and analog transistors (144) are formed at the same time. The digital transistors (140) include pocket regions (134) for optimum performance. These pocket regions (134) are partially or completely suppressed from at least the drain side of the analog transistors (144) to provide a flat channel doping profile on the drain side. The flat channel doping profile provides high early voltage and higher gain. The suppression is accomplished by using the HVLDD implants for the analog transistors (144).

17 Claims, 6 Drawing Sheets

METHOD TO PARTIALLY OR COMPLETELY SUPPRESS POCKET IMPLANT IN SELECTIVE CIRCUIT ELEMENTS WITH NO ADDITIONAL MASK IN A CMOS FLOW WHERE SEPARATE MASKING STEPS ARE USED FOR THE DRAIN EXTENSION IMPLANTS FOR THE LOW VOLTAGE AND HIGH VOLTAGE TRANSISTORS

CROSS-REFERENCE TO RELATED APPLICATION

This application claims priority under 35 USC § 119(e)(1) of provisional application numbers 60/138,728 filed Jun. 11, 1999.

The following co-pending patent application is related and hereby incorporated by reference:

| Serial No. | Filing Date | Inventors |
|---|---|---|
| (TI-29254) | 06/11/99 | Efland et al. |

FIELD OF THE INVENTION

The invention is generally related to the field of semiconductor devices and more specifically to fabricating semiconductor devices having both analog and digital transistors.

BACKGROUND OF THE INVENTION

As digital CMOS technology extended into the deep submicron range (e.g., 0.35 μm and below), a device feature was developed to enable a much shorter channel length. This particular feature is a pocket implant. As shown in FIG. 1, pocket implants are used to provide a pocket region 16 of heavier doping of the same conductivity type as the channel/body 18 of the CMOS transistor 20. In some approaches, multiple pocket implants are performed. Pocket regions 16 are extend further under the gate than drain extension regions 24. The drain 12 and source 14 regions are generally of opposite conductivity type with respect to the channel/body 18.

The pocket implant energy and the anneal temperatures and times are designed such that the final dopant distribution serves to increase the channel doping concentration. The increased channel doping concentration reduces the depletion regions arising due to the electrostatic potential differences between source and the substrate and, more importantly, between the drain and the substrate. Such reduction in the depletion regions is known to result in improved short-channel characteristics, in particular, it leads to a reduced drain-induced barrier lowering or DIBL effect. Reduction in DIBL is critical to the ability to scale the MOSFET to smaller channel lengths without a concurrently sharp increase in subthreshold leakage. The key feature that has led to the use of pocket implants to increase the channel doping concentration in preference to the more conventional threshold voltage adjust implants is the fact that pocket implants are self-aligned to the gate. This means that the implant is largely blocked by the gate material so that the increased channel doping density due to the implant occurs only in the vicinity of the source and drain regions. One consequence of this is that the average doping density in the channel is low at long channel lengths and increases as the channel length is reduced. This is a desirable feature because the higher doping helps suppress the undesirable DIBL effect which is worse at smaller channel lengths, while at the longer lengths where such a high doping density is not needed the lower doping density results in higher inversion charge when the transistor gate is biased to turn on and conduct current. Higher inversion charge leads to a correspondingly higher drive current. Thus, over a statistical distribution of channel lengths one is able to obtain a higher drive current while maintaining a low off current.

High drive current increases the switching speed of digital logic gates, especially when the gates are required to drive large loads such as a long metal line. Low off current leads to a low standby power for CMOS logic circuits. Thus, MOSFETs designed with pocket implants are very attractive for high performance CMOS digital logic circuits. However, that is not true for many of the CMOS analog circuits. For example, the dc voltage gain of a CMOS differential amplifier is high for high values of gm/gds, where gm is the MOSFET's small signal transconductance and gds is the MOSFET's small-signal output conductance. Also, the standby power depends on the dc bias current, where the bias current value is designed for high gm/gds.

Unfortunately, it turns out that the high doping density localized near the drain region of MOSFETs, so typical of transistors with pocket implants, also makes it difficult to achieve a low gds. The self-aligned pocket implants naturally lead to a laterally nonuniform channel doping profile with the doping density low at the center and increasing to a pocket of high doping near the drain, as shown in FIG. 2. Such a profile causes an increasing potential barrier for the charge carriers (electrons for nMOS and holes for PMOS) to flow from the center to the drain. Being coincident with the pocket of high channel doping density in the vicinity of the drain, the magnitude of potential barrier is relatively easily modulated by the voltage Vds applied to the drain electrode. Increasing the magnitude of Vds (Normally, Vds >0 for nMOS and Vds <0 for pMOS) lowers the barrier and vice versa. Consequently, the MOSFET output characteristic, which is the drain current Ids vs Vds at a constant gate bias of Vgs, fails to saturate as well as it otherwise should. Thus, generally, pocket implanted MOSFETs exhibit a relatively high slope (high gds) in the saturation region compared to conventional MOSFETs with a laterally uniform channel, as shown in FIG. 3. Furthermore, since the pocket and the accompanying potential barrier is present at long and short lengths, the rapid improvement (i.e., reduction) in gds with increasing channel length, commonly seen for conventional MOSFETs, is typically absent for MOSFETs with pocket implants. Thus, with pocket implanted devices one does not even have the option of increasing the gate length to achieve the high gm/gds needed for acceptable analog performance.

There is a need in modern technologies to be able to build advanced circuitry of both a digital and analog nature on the same integrated circuit. Therefore, there is a need for a method of producing transistors that are more analog friendly along with digital transistors in the same monolithic solution.

SUMMARY OF THE INVENTION

The invention uses conventional mask steps in a process flow with high and low voltage transistors to provide at least a more laterally uniform channel profile near the drain end of a second type of low voltage transistor (e.g., analog) relative to the corresponding profile in a first type of low voltage transistor (e.g., core digital transistors). Drain extension implants for the high voltage transistors are simultaneously performed in the high voltage transistor regions and the second type of low voltage transistor regions. Thus, the second type of low voltage transistors exhibit output characteristics (drain current $I_d$ vs drain voltage $V_{ds}$ at constant gate and body potentials) where the drain currents saturate to low values of small signal output conductance $g_{ds}$ ($g_{ds}=\partial I_d/\partial V_{ds}$). In contrast, the first type of low voltage digital transistors retains the highly nonuniform pocket profiles and exhibit output characteristics with higher values of gds in the saturation region.

These and other advantages will be apparent to those of ordinary skill in the art having reference to the specification in conjunction with the drawings.

DETAILED DESCRIPTION OF THE EMBODIMENTS

The invention is a method for partially or completely suppressing the pocket implant in selective circuit elements with no additional mask steps in a CMOS process with separate masking steps for the drain extension implants in low voltage and high voltage transistors. The invention is particularly applicable to form analog devices with partially or completely suppressed pockets. It will be apparent to those of ordinary skill in the art that the benefits of the invention may be applied to other processes and devices.

The conventional pocket regions are undesirable for analog devices because the pocket region gives an output characteristic that is undesirable. The pocket of higher channel doping near the drain region gives rise to a potential barrier that is easily modulated by the drain voltage ($V_{ds}$) Consequently, the output conductance in saturation is high and does not reduce with increasing gate length as significantly as it does for MOSFETs without pocket regions.

Figure 1:
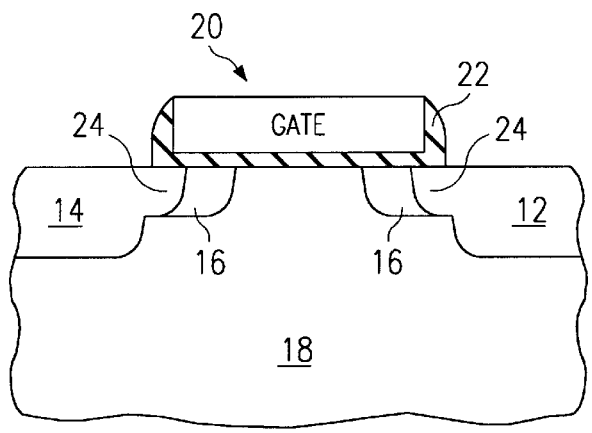
FIG. 1 is a cross-sectional diagram of a prior art MOS transistor with pocket implants.
Figure 2:
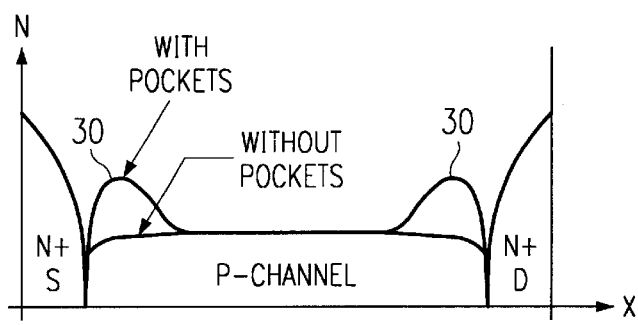
FIG. 2 is a graph of doping concentration across the channel of the MOS transistor with pockets and without pockets.
Figure 3:
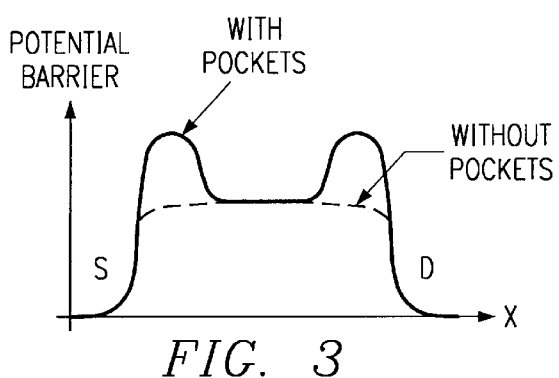
FIG. 3 is a graph of potential barrier for a MOS transistor with and without pockets.
Figure 4:
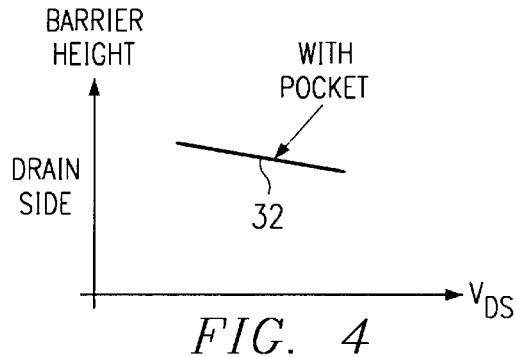
FIG. 4 is a graph of barrier height, $V_{ds}$ for a MOS transistor with pockets.

As shown in FIG. 2, the pocket implants for a nMOS device create regions where the dopant concentration increases to a peak 30 at the source and drain ends of the channel. Such nonuniform profiles with regions of high dopant concentration do not occur without pockets. Without pockets, the channel dopant profile is relatively flat in the lateral direction. The peaks 30 result in potential barriers for electrons at both the source and drain ends at $V_{gs}=0$ and $V_{ds}$ biased in saturation, as shown in FIG. 3. The potential barrier 32 at the drain end is not present without pockets. For the pocket devices, the barrier 32 at the drain end persists even for $V_{gs}>V_T$, ($V_T$ is the MOSFET threshold voltage). Because of its proximity to the drain, the height of the barrier 32 is actually modulated with drain voltage as shown in FIG. 4. This modulation is reflected by a corresponding modulation of $I_d$ in saturation. On the other hand, the barrier at the source end, being further from the drain, is relatively unaffected by $V_{ds}$. Without pockets, relatively constant saturation $I_d$, i.e., a low $g_{ds}$, is obtained.

Figure 5:
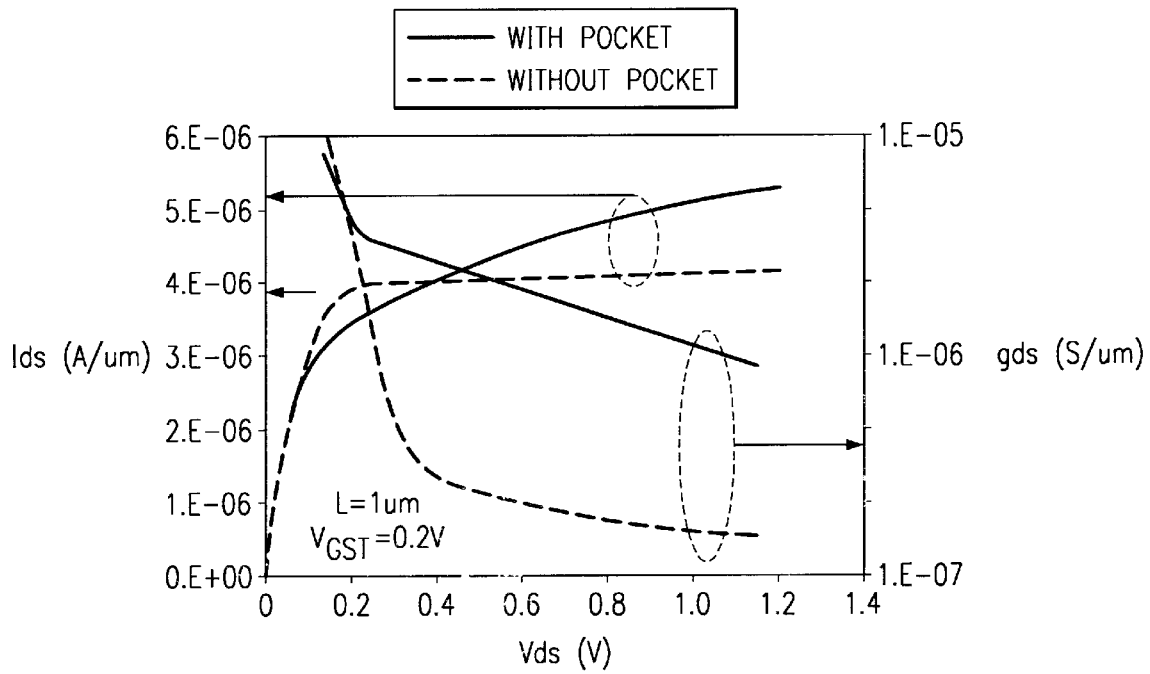
FIG. 5 is a graph of $I_{ds}$-$V_{ds}$ and $g_{ds}$-$V_{ds}$ characteristics for a MOS transistor with pockets and without pockets.
Figure 6:
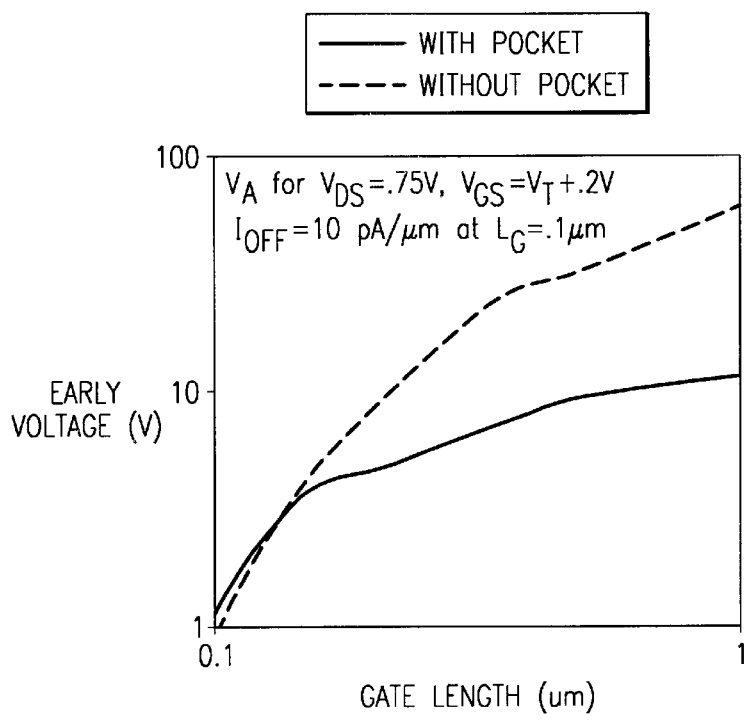
FIG. 6 is a graph of Early Voltage versus gate length for a MOS transistor with and without pockets.

In terms of electrical characterization of the device, digital performance is relatively insensitive to the flatness of the I-V characteristic. Rather, pocket implants are preferred for digital logic. Pocket implants reduce sensitivity of the drive currents $I_{drive}$ and the off currents $1_{off}$ to statistical variations in gate length, which makes it possible to achieve a much higher drive current at the nominal gate length to enable quick charging. However, for analog functions this slope needs to be very flat as shown in FIG. 5 (without pockets). Horizontal is ideal. If a line is drawn tangential to this saturated characteristic and extrapolated back to the Vds axis, the voltage value at which the axis is crossed is the "Early voltage" (Va). Va is a parameter that characterizes the output resistance, Rd, or the output conductance, gds, of a MOSFET. A large Va means a large Rd or small gds. Obviously, when the saturated characteristic is flat, then the Va is very high. In fact, a perfectly flat curve would relate to zero slope and Va=infinity. Generally, a slope resulting in a Va of 50V to 100V is usual and a good value for building analog circuitry. However, the Va associated with the with pockets curve of FIG. 5 is significantly less for the same saturation current than the 50V to 100V needed for analog functions. FIG. 6 is a graph of Va versus gate length. It shows that the early voltage, Va, is significantly greater without pockets versus with pockets for a given gate length. Thus, a transistor with at least partially suppressed pocket regions is desired for analog transistors.

In a conventional CMOS process, the drain extension or lightly doped drain (LDD) and the pocket implants are performed using the same mask for the low voltage transistors. One approach to suppressing the pocket in analog devices is to add a masking level for the pocket implant. The low voltage LDD (LVLDD) mask would be used to implant LVLDD regions in both analog and digital transistors, but the pocket mask would block the analog transistors and only implant in the digital transistors. The problem with this approach is the cost of adding masking levels.

Figure 7A:
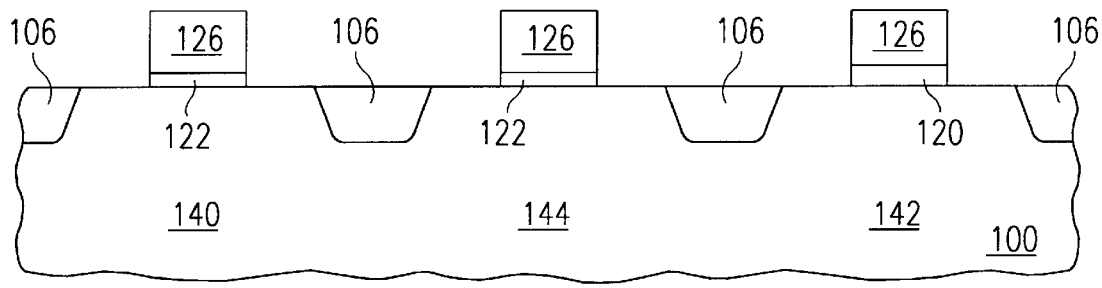
FIGS. 7A–7C are cross-sectional diagrams of digital and analog transistors according to the first embodiment of the invention at various stages of fabrication.

The embodiments of the invention are applied to a CMOS process having both low voltage transistors and high voltage transistors. The terms low voltage and high voltage are relative to each other and refer to the operating voltage of the transistors. Typically, core transistors have a lower operating voltage (e.g., 1.8 V) while I/O transistors have a higher operating voltage (e.g., 3.3 V). A semiconductor substrate 100 is processed through gate 126 formation, as shown in FIG. 7A. This includes the formation of isolation structures, such as STI 106, threshold adjust implants, low voltage gate dielectric 122, and a thicker high voltage gate dielectric 120. FIG. 7A shows three transistor areas: a first low voltage (digital) transistor area 140, a high voltage (I/O) transistor area 142, and a second low voltage (analog) transistor area 144.

Figure 7B:
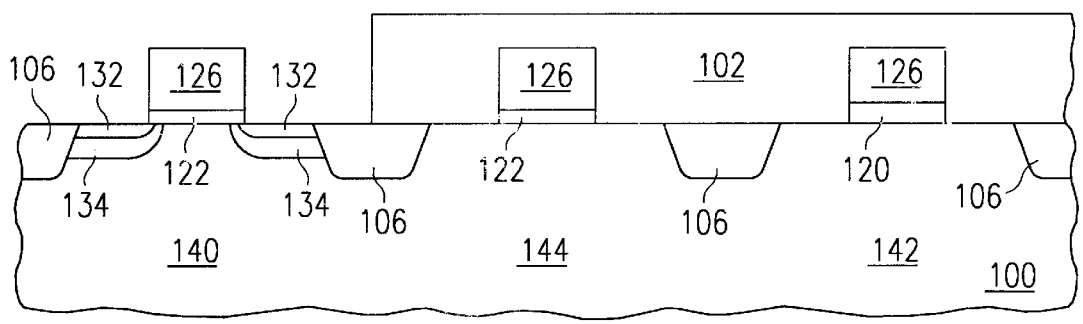

In the first embodiment, the LVLDD mask is modified to form a LVLDD pattern 102 to expose only the first low voltage transistor areas 140, as shown in FIGS. 7B (cross-section) and 8A (top view). The high voltage (typically I/O) transistor areas 142 and the second low voltage (analog) transistor areas 144 90 are masked. The LVLDD mask 102 is then used for both the LDD 132 implant and the pocket 134 implant for the first low voltage transistor areas 140. The LDD 132 implant uses a dopant of opposite conductivity to the dopant used for the pocket 134 implant. As an example, arsenic may be used for the LDD implant and $BF_2$ for the pocket implant for an NMOS transistor. The LVLDD mask 102 is then removed.

Figure 7C:
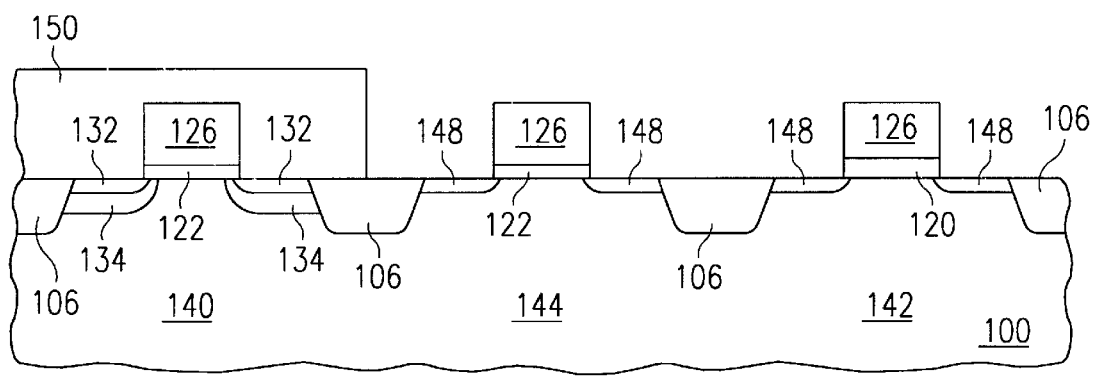
Figure 8A:
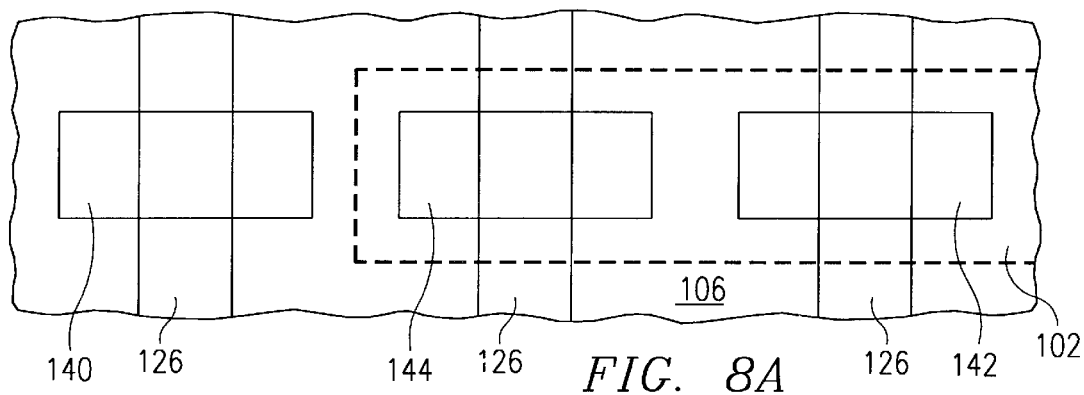
FIGS. 8A and 8B are top view diagrams of the digital and analog transistors according to the first embodiment of the invention.
Figure 8B:
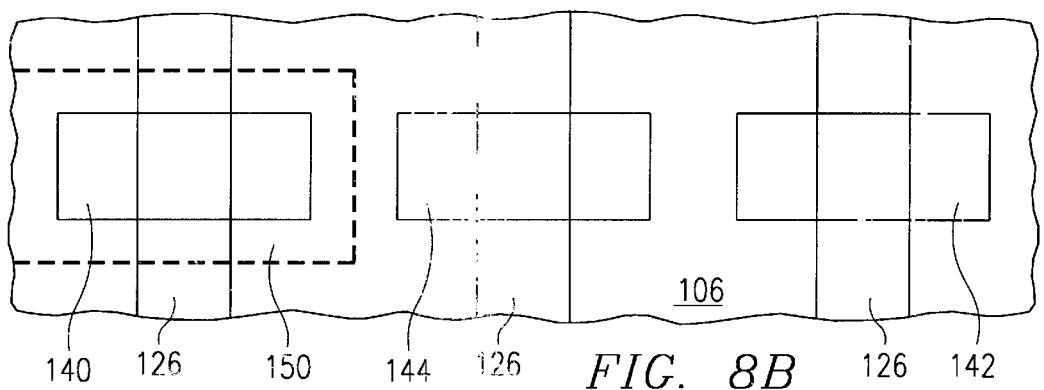

The LDD regions 148 for the high voltage transistors and the second type of low voltage transistors are formed simultaneously. For example, a HVLDD (high voltage lightly doped drain) mask creates a pattern 150 that exposes both the high voltage transistor areas 142 and the second low voltage transistor areas 144, as shown in FIGS. 7C and 8B. Pattern 150 is then used to form a HVLDD region 148 but not a pocket region. The pocket is completely suppressed for the analog transistors. The HVLDD region 148 may, for example, be formed using arsenic and phosphorous for n-type or boron for p-type.

It should be noted that the order for forming core and I/O transistor regions may be reversed from that shown without departing from the invention.

The HVLDD implants are designed to form a graded junction to reduce the maximum lateral electric field in order to meet reliability specifications, in particular, channel hot carrier (CHC) lifetime spec. On the other hand, the lower voltage used in the core allows the LVLDD implants to be designed for an abrupt junction. The HVLDD implants may differ from the LVLDD implants in several ways. Two such differences that are relevant for this invention are: (i) the HVLDD profiles extend deeper in both vertical and lateral directions to form graded junctions and (ii) the pocket implants used in the LVLDD implants are not used in conjunction with the HVLDD implants. Thus, the masking scheme of the first embodiment (referred to as the analog symmetric) has the advantage of achieving a much lower gds in the saturation region of operation.

Figure 9A:
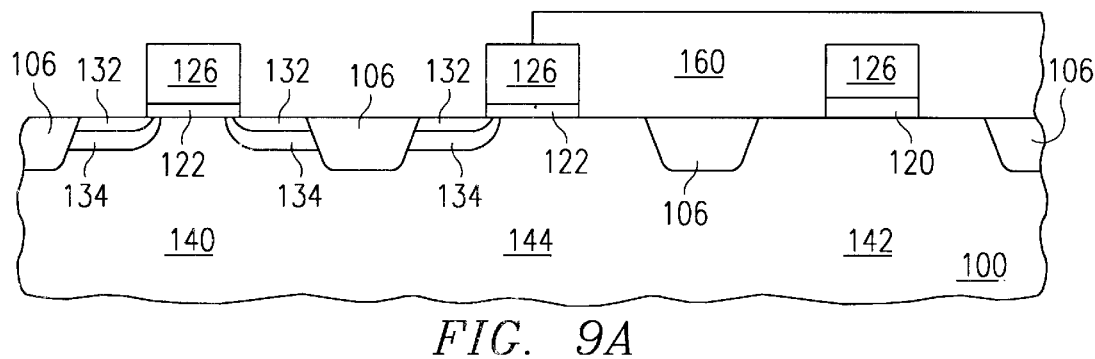
FIGS. 9A–9B are cross-sectional diagrams of digital and analog transistors according to the second embodiment of the invention at various stages of fabrication.
Figure 9B:
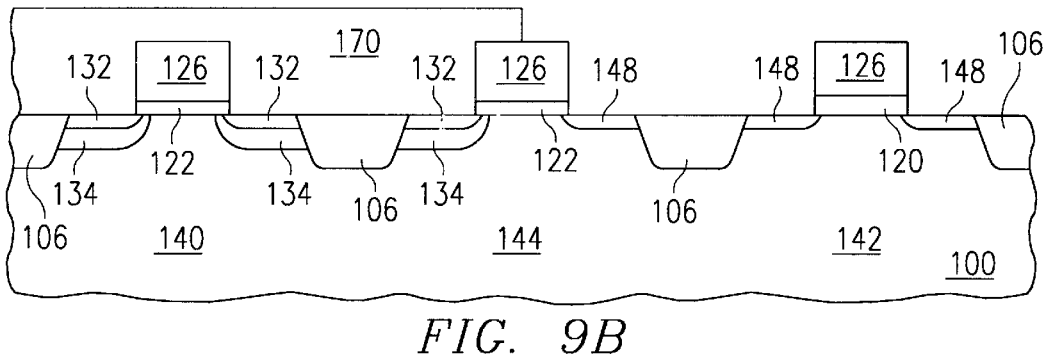
Figure 10A:
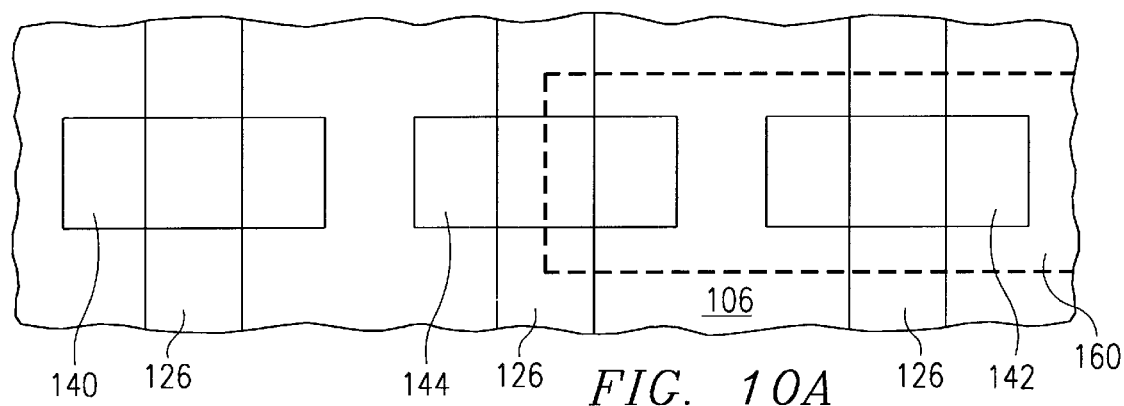
FIGS. 10A and 10B are top view diagrams of the digital and analog transistors according to the second embodiment of the invention.
Figure 10B:
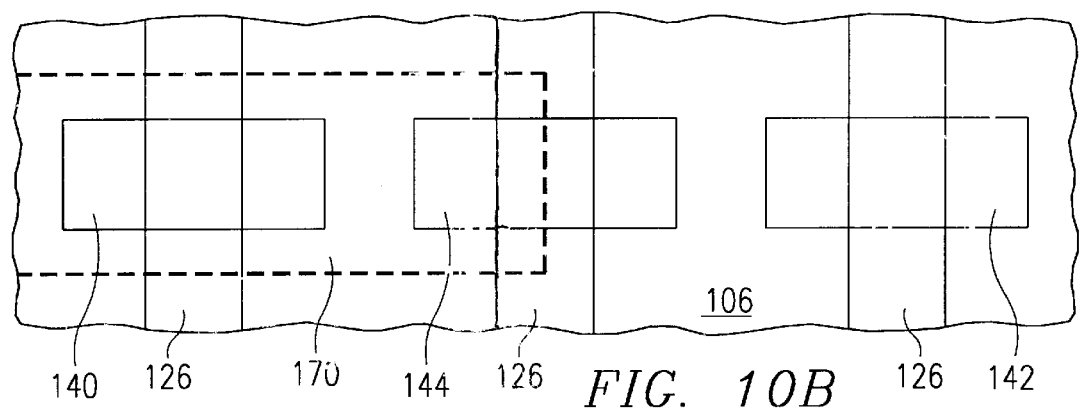

In a second embodiment of the invention, the LVLDD mask is modified to form a LVLDD pattern 160 to expose the first low voltage (digital) transistor areas 140 and a source side of the second low voltage (analog) transistor areas 144, as shown in FIG. 9A and 10A. The high voltage (typically I/O) transistor areas 142 and the drain side of the second low voltage (analog) transistor areas 144 are masked. The LVLDD mask is then used for both the LDD 132 implant and the pocket implant 134 for the low voltage digital transistor areas 140. The HVLDD (high voltage lightly doped drain) mask creates a pattern 170 that exposes both the high voltage transistor areas 142 and the drain side of the analog transistor areas 144, as shown in FIG. 9B and 10B. Pattern 170 is then used to form a HVLDD region 148 but not a pocket region. The pocket is completely suppressed form the drain side of the analog transistor areas 144. However, a pocket 134 is formed on the source side of the analog transistor areas 144.

The source side only pocket (analog asymmetric) has two important advantages. First, similar to the analog symmetric, it achieves improved analog performance (higher Va) over the digital devices by allowing a flat channel profile on the drain side of the transistor as it suppresses the drain side pocket. Second, the source side only pocket suppresses DIBL at shorter channel lengths by supplying a higher doped region on the source side to stand off depletion spreading from the drain end to lower the barrier at the source end. This leads to the analog asymmetric devices to have higher Va compared to the analog symmetric devices at the shorter gate lengths.

The source side only pocket for high performance analog CMOS is achievable and compatible with building state of art deep submicron digital CMOS in the same process at the same time on the same silicon substrate using the same wafer fabrication steps.

Figure 11A:
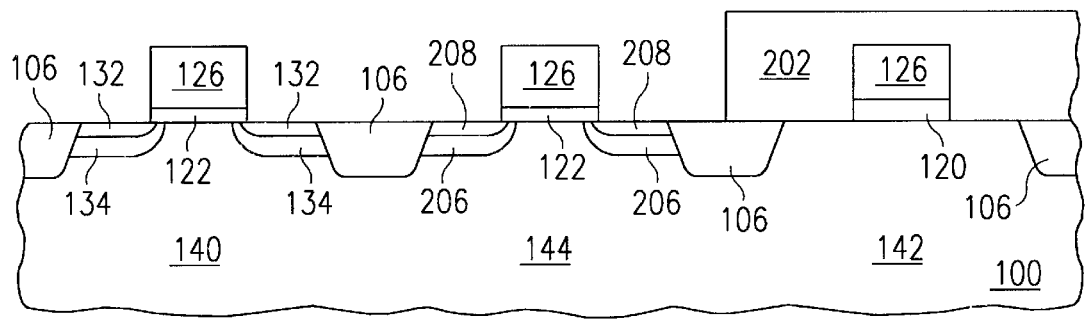
FIGS. 11A–11B are cross-sectional diagrams of digital and analog transistors according to the third embodiment of the invention at various stages of fabrication.
Figure 11B:
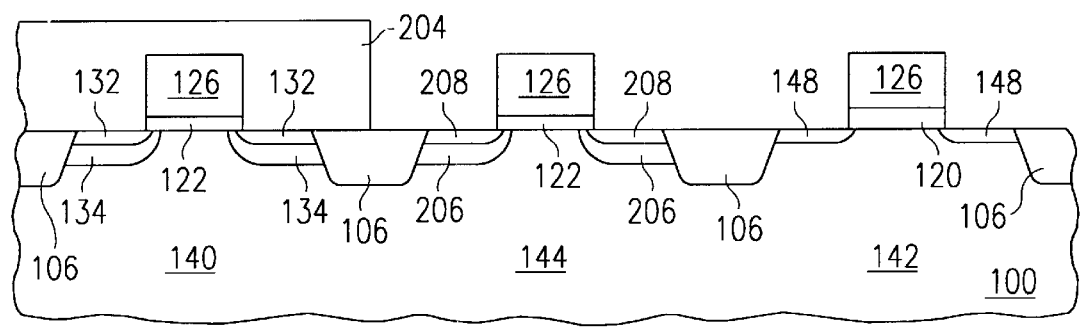
Figure 12A:
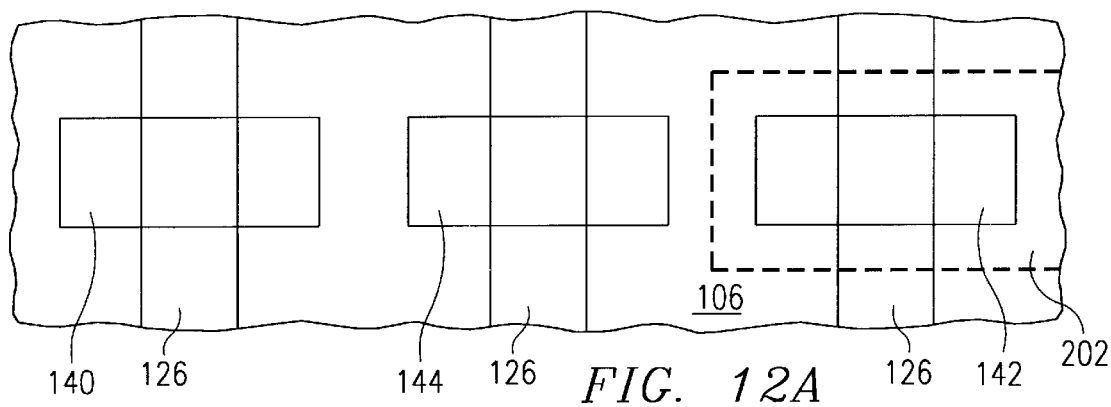
FIGS. 12A and 12B are top view diagrams of the digital and analog transistors according to the third embodiment of the invention.
Figure 12B:
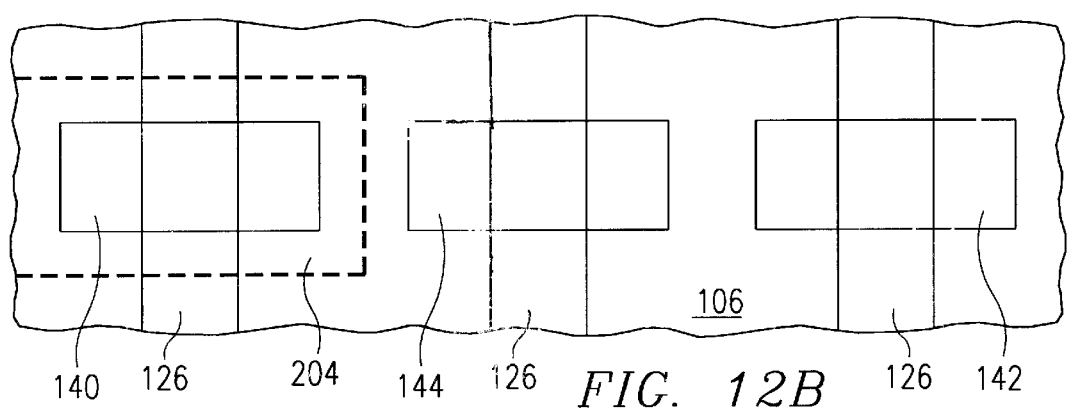

In a third embodiment of the invention the pocket regions for the analog transistors are partially suppressed. The LVLDD mask is used to form a pattern 202 to expose the low voltage digital transistor areas 140 and the low voltage analog transistor areas 144, as shown in FIGS. 11A and 12A. The high voltage (typically I/O) transistor areas 142 are masked. The LVLDD mask is then used for both the LDD 132 implant and the pocket 134 implant for the low voltage digital transistor areas 140 and the LDD 208 and pocket 206 in the analog transistor areas 144. The HVLDD (high voltage lightly doped drain) mask creates a pattern 204 that exposes both the high voltage transistor areas 142 and the analog transistor areas 144, as shown in FIGS.11 B and 12B. Pattern 204 is then used to form a HVLDD region 148 in the high voltage digital transistor areas and to counterdope the pocket regions 206 in the analog transistor areas 144. The pocket regions 206 are partially suppressed for the analog transistors.

Figure 13:
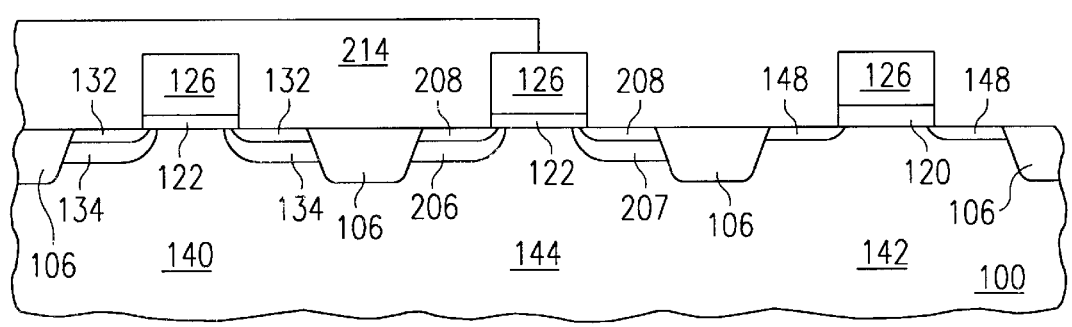
FIG. 13 is a cross-sectional diagram of digital and analog transistors according to the fourth embodiment of the invention.
Figure 14:
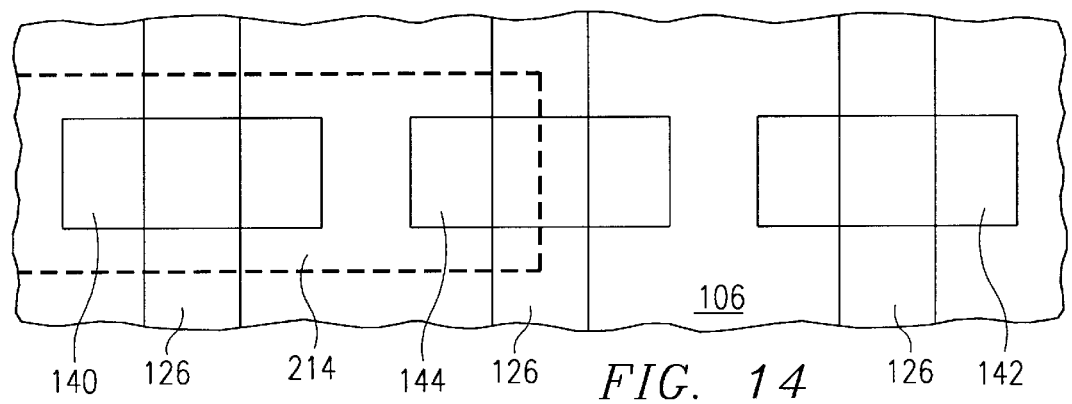
FIG. 14 is a top view diagram of the digital and analog transistors according to the fourth embodiment of the invention.

In a fourth embodiment of the invention the pocket regions for the analog transistors are partially suppressed on the drain side only. In this embodiment, the LVLDD mask is not modified from the conventional process. The LVLDD mask is used to form a pattern 202 to expose the low voltage digital transistor areas 140 and the low voltage analog transistor areas 144, as shown in previous FIGS. 11A and 12A. The high voltage (typically I/O) transistor areas 142 are masked. The LVLDD mask is then used for both the LDD 132 implant and the pocket 134 implant for the low voltage digital transistor areas 140 and the LDDs 208 and pockets 206 in the analog transistor areas 144. The HVLDD (high voltage lightly doped drain) mask creates a pattern 214 that exposes both the high voltage transistor areas 142 and the drain side of the analog transistor areas 144, as shown in FIGS. 13 and 14. Pattern 214 is then used to form a HVLDD region 148 in the high voltage digital transistor areas and to counterdope the pocket region 206 creating pocket region 207 in the drain side of the analog transistor areas 144. The pocket region 207 is partially suppressed for the analog transistors.

One advantage of retaining the LVLDD implant on either the drain or source side is to lower the parasitic series resistance. The lower series resistance is a result of the typically higher number of donor type dopants for the nMOS and acceptor type dopants for the pMOS implanted during the LVLDD implants.

After forming the LVLDD and HVLDD regions according to any of the above embodiments, conventional processing may be used. For example, sidewall spacers may be formed followed by the n-type and p-type source/drain regions. Fabrication may then continue with a standard metal backend process.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit, comprising the steps of:
    forming a plurality of isolation structures in a semiconductor body;
    forming a plurality of gate structures over said semiconductor body;
    forming a first masking layer exposing the first type of low voltage transistor and masking the second type of low voltage transistor and the higher voltage transistor prior to forming the first drain extension regions;
    forming first drain extension regions in a first type of low voltage transistor;
    removing the second masking layer after forming the first drain extension regions;
    forming pocket regions in said first type of low voltage transistor;
    forming a second masking layer exposing tile higher voltage transistor and the second type of low voltage transistor and masking the first type of low voltage transistor prior to forming the second drain extension regions;
    simultaneously forming second drain extension regions in a higher voltage transistor and in at least a drain side of a second type of low voltage transistor; and
    removing the second masking layer after forming the second drain extension regions.

2. The method of claim 1, wherein said at least the drain side of the second type of low voltage transistor includes a source side of the second type of low voltage transistor.

3. The method of claim 1, wherein said step of forming said first drain extension regions comprises implanting arsenic and wherein said step of forming said second drain extension regions comprises implanting arsenic and phosphorous.

4. The method of claim 1, wherein said step of forming said first drain extension regions comprises implanting $BF_2$ and wherein said step of forming said second drain extension regions comprises implanting boron.

5. The method of claim 1, wherein said step of forming a plurality of gate structures comprises:
    forming first gate dielectric layers over the semiconductor body in the first type of low voltage transistor and the second type of low voltage transistor;
    forming a second gate dielectric layer thicker than said first gate dielectric layers in said higher voltage transistor.

6. The method of claim 1, wherein the step of simultaneously forming second drain extension regions in a higher voltage transistor and in at least a drain side of a second type of low voltage transistor occurs prior to said step of forming first drain extension regions.

7. A method of fabricating an integrated circuit having first low voltage transistors, higher voltage transistors, and second low voltage transistors comprising the steps of:
    forming a plurality of isolation structures in a semiconductor body;
    forming a plurality of first gate dielectric layers over said semiconductor body in a first low voltage transistor region and a second low voltage transistor region;
    forming a plurality of second gate dielectric layers thicker than the first gate dielectric layers over the semiconductor body in a higher voltage transistor region;
    forming a plurality of gate electrodes over said first and second gate dielectric layers;
    forming a first masking layer to expose the first low voltage transistor region;
    forming first drain extension regions in the first low voltage transistor region using the first masking layer;
    forming pocket regions in the first low voltage transistor region using the first masking layer;
    removing the first masking layer;
    forming a second masking layer to cover said first low voltage transistor region and expose said higher voltage transistor region and at least the drain side of the second low voltage transistor region,
    simultaneously forming second drain extension regions in said higher voltage transistor region and in at least said drain side of said second low voltage transistor region, wherein said step of forming the second drain extension regions uses said second masking layer.

8. The method of claim 7, wherein the second drain extension regions are also formed in a source side of the second low voltage transistor regions.

9. The method of claim 7, wherein said second masking layer expose a source side of the second low voltage transistor region.

10. The method of claim 7, wherein the step of forming the first masking layer exposes said first low voltage transistor region and said second low voltage transistor region and covers said higher voltage transistor region, and
    wherein said step of forming the second drain extension regions counterdopes at least the drain side of the second low voltage transistor region.

11. A method of fabricating an integrated circuit, comprising the steps of:
    forming a plurality of isolation structures in a semiconductor body;
    forming a plurality of gate structures over said semiconductor body;
    forming first drain extension regions in a first transistor region and a second transistor region;
    forming pocket regions in said first transistor region and said second transistor region;
    forming second drain extension regions in a third transistor region while counterdoping a subset of said pocket regions located in at least a drain side of said second transistor region.

12. The method of claim 11, wherein said at least said drain side of said second transistor region includes a source side of said second transistor region.

13. The method of claim 11, wherein said step of forming said first drain extension regions comprises implanting arsenic and wherein said step of forming said second drain extension regions comprises implanting phosphorous.

14. The method of claim 11, wherein said step of forming said first drain extension regions comprises implanting boron and wherein said step of forming said second drain extension regions comprises implanting $BF_2$.

15. The method of claim 11, wherein said first transistor region comprises at least one core transistor.

16. The method of claim 11, wherein said third transistor region comprises at least one I/O transistor.

17. The method of claim 11, wherein said second transistor region comprises at least one analog transistor.

* * * * *